United States Patent [19]
Sakamoto et al.

[11] Patent Number: 5,648,653
[45] Date of Patent: Jul. 15, 1997

[54] OPTICAL FILTER HAVING ALTERNATELY LAMINATED THIN LAYERS PROVIDED ON A LIGHT RECEIVING SURFACE OF AN IMAGE SENSOR

[75] Inventors: Junichi Sakamoto; Seitoku Tsukamoto; Mitsuharu Sawamura, all of Yokohama; Motomu Fukasawa, Tokyo, all of Japan

[73] Assignee: Canon Kabushiki Kaisha, Tokyo, Japan

[21] Appl. No.: 324,707

[22] Filed: Oct. 18, 1994

[30] Foreign Application Priority Data

Oct. 22, 1993 [JP] Japan ................................. 5-286291
Oct. 22, 1993 [JP] Japan ................................. 5-286292

[51] Int. Cl.⁶ ............................. H01L 27/00; H04N 1/46
[52] U.S. Cl. ....................... 250/208.1; 250/226; 358/515
[58] Field of Search ........................... 250/208.1, 226, 250/216; 358/500, 515

[56] References Cited

U.S. PATENT DOCUMENTS

| | | |
|---|---|---|
| 3,679,291 | 7/1972 | Apfel et al. . |
| 3,978,512 | 8/1976 | Hoeberechts . |
| 3,996,461 | 12/1976 | Sulzbach et al. . |
| 4,320,936 | 3/1982 | Sawamura ................. 350/1.6 |
| 4,547,074 | 10/1985 | Hinoda et al. ............. 356/405 |
| 4,679,068 | 7/1987 | Lillquist et al. ........... 358/44 |
| 4,956,555 | 9/1990 | Woodberry ................. 250/339 |
| 4,960,310 | 10/1990 | Cushing ..................... 350/1.7 |
| 5,035,485 | 7/1991 | Kageyama ................. 350/164 |
| 5,140,411 | 8/1992 | Haneda et al. ............. 358/75 |
| 5,164,858 | 11/1992 | Aguilera, Jr. et al. .... 359/587 |
| 5,166,784 | 11/1992 | Suda et al. ................ 358/75 |
| 5,321,250 | 6/1994 | Tajima ...................... 250/208.1 |
| 5,337,191 | 8/1994 | Austin ....................... 359/885 |
| 5,377,045 | 12/1994 | Wolfe et al. ............... 359/585 |
| 5,413,864 | 5/1995 | Miyazaki et al. ......... 428/432 |
| 5,444,302 | 8/1995 | Nakajima et al. ........ 257/755 |
| 5,455,453 | 10/1995 | Harada et al. ............ 257/675 |

FOREIGN PATENT DOCUMENTS 59-225564 12/1984 Japan .
62-174716 7/1987 Japan .

OTHER PUBLICATIONS

Patent Abstracts Of Japan, vol. 9, No. 109 (P-355) 14 May 1985 & JP-A-59 230 123 (Kogyo Gijutsuin) 24 Dec. 1984 *abstract*.
Patent Abstracts Of Japan, vol. 7, No. 54 (P-180) 4 Mar. 1983 & JP-A-57 201 825 (Tateishi Denki KK) 10 Dec. 1982 *abstract*.
Patent Abstracts Of Japan, vol. 14, No. 288 (E-943) 21 Jun. 1990 & JP-A-02 090 870 (Canon Inc) 30 Mar. 1990 *abstract*.

*Primary Examiner*—Stephone Allen
*Attorney, Agent, or Firm*—Fitzpatrick, Cella, Harper & Scinto

[57] ABSTRACT

An Optical filter is provided on a light receiving surface of an image sensor. The filter has a plurality of thin layers alternately laminated. The thin layers alternately consist of a dielectric layer having a high refractive index and a metal layer and each thin layer has its stress $\sigma$ in a range $-5 \text{ GPa} \leq \sigma < -0.2 \text{ GPa}$.

11 Claims, 15 Drawing Sheets

FIG. 3
FLATTENING
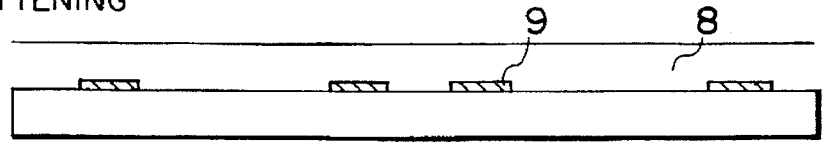
FILM FORMING
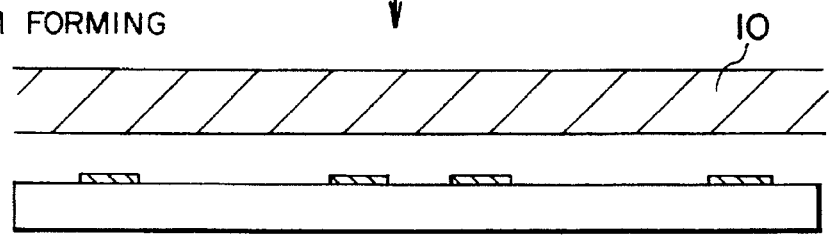
PATTERNING
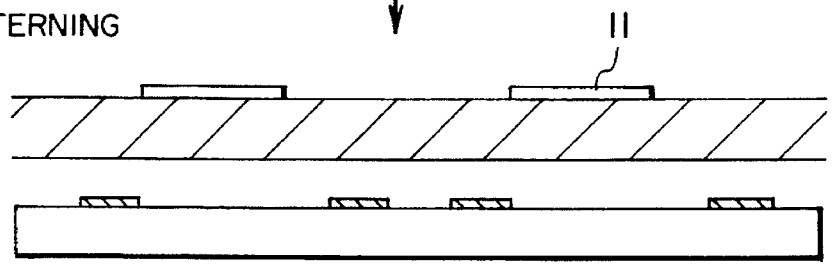
DICING
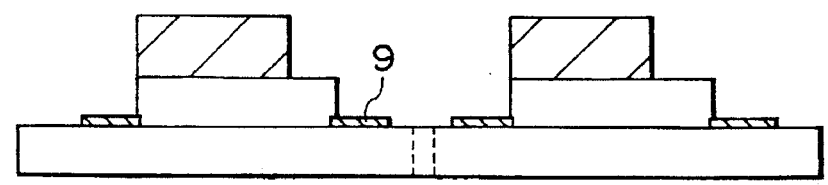
WIRE BONDING
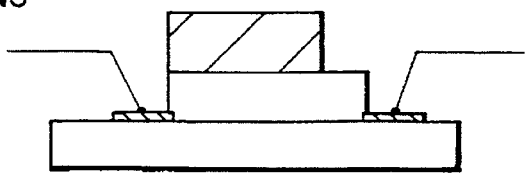
PACKAGING
(GLASS SEALING)
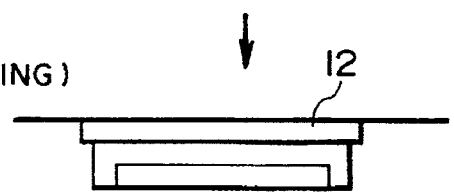

F I G. 15
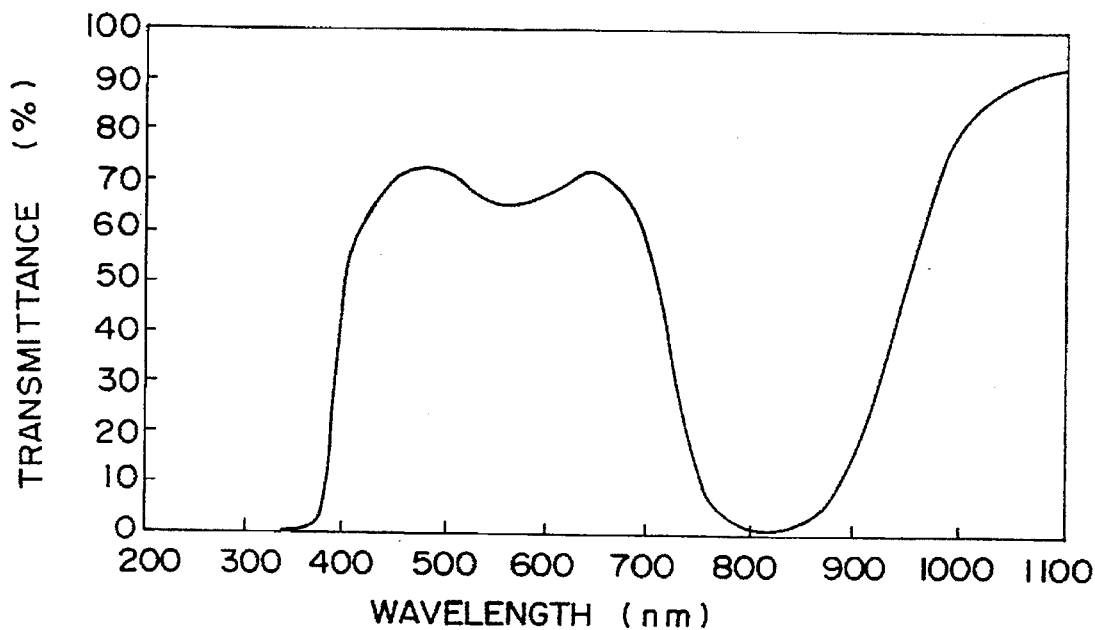
F I G. 16
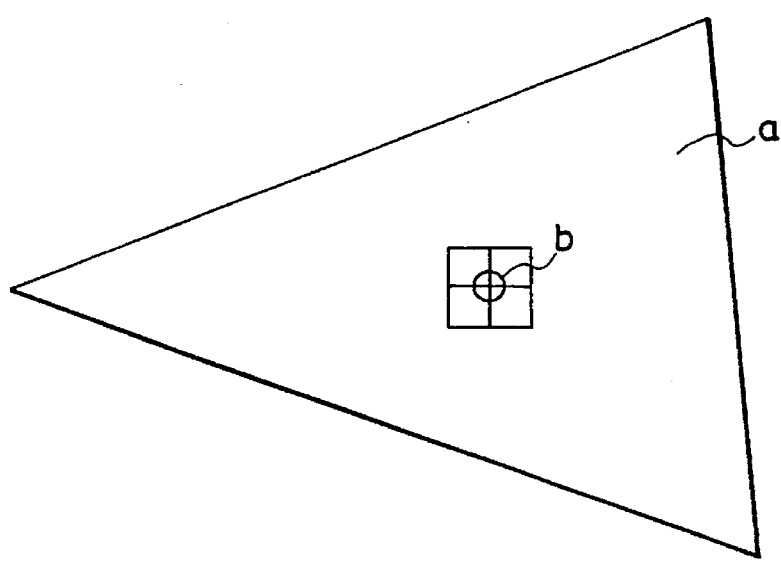

F I G. 19
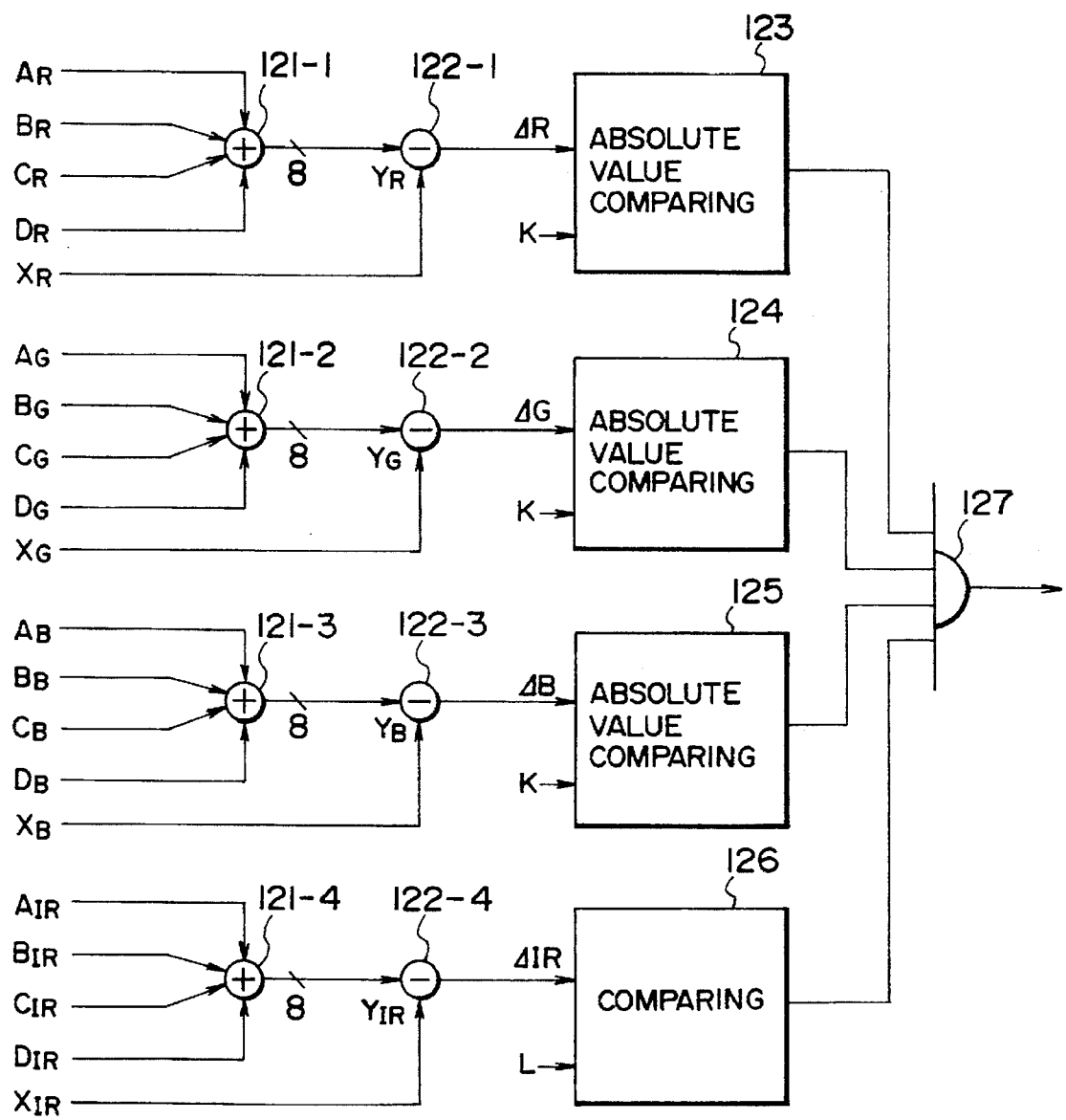

OPTICAL FILTER HAVING ALTERNATELY LAMINATED THIN LAYERS PROVIDED ON A LIGHT RECEIVING SURFACE OF AN IMAGE SENSOR

BACKGROUND OF THE INVENTION

1. Field of the Invention

The present invention relates to a filter for image sensor, and more particularly to a filter for image sensor for converting an optical signal not only in the visible but also in the non-visible region into electrical signal.

The invention is also suitably employed for a filter for image sensor for use in an image information processing device such as a facsimile, an image scanner, or a copying machine.

2. Related Background Art

In recent years, the uses of solid-state image pickup devices have been diversified, with new functions becoming needed. For example, in addition to having higher image quality and color picture for use in copying machines, they are required to recognize, reproduce and record an invisible image. Such image, or invisible image may be an image formed by ink having the characteristic of absorbing ultraviolet or infrared rays. The sensor technology for recognizing such images uses both a sensor for sensing the visible light and a sensor for sensing the invisible light.

In a copying machine for forming an image by sensing only visible light, an infrared cut-off filter has been disposed on the optical path between a solid-state image pickup device having color filters of red (R), green (G), and blue (B) provided on an IC chip of an image sensor such as a CCD and the original to enhance color separation ability. Accordingly, when reading and reproducing a printed image as the visible image, using an infrared absorbent ink, for example, one method can be conceived in which an optical system dedicated for infrared rays without an infrared cut-off filter is prepared, apart from the optical path of visible light, to image the infrared rays onto the solid-state image pickup device for the detection of infrared rays.

However, since the above-mentioned method is associated with a complex optical system, the present inventors have sought a new method which adopts a sensor in which a sensor for sensing the infrared rays and a sensor for sensing the RGB rays are integrated monolithically into one chip. However, this new method can not provide a conventional infrared cut-off filter in the optical path, because of its necessity of sensing the infrared rays.

Accordingly, a way of disposing an invisible light cut-off filter represented by an infrared cut-off filter must be improved, because otherwise one could not possibly make effective use of the advantages of the above new method.

For example, in Japanese Laid-open Patent Application No. 59-225564 or No. 62-174716, attempts have been made to integrate together a sensor for sensing the infrared rays and a sensor for sensing the RGB rays, but none of them have referred to the specific constitution of its filter.

On the other hand, there have been disclosed CCD image sensors capable of sensing the infrared rays and the visible rays in the specifications of U.S. patent application Ser. Nos. 174,444 (filed on Dec. 28, 1993), 174,453 (filed on Dec. 28, 1993), and 139,174 (filed on Oct. 21, 1993), assigned to the same assignee of the present application.

In particular, in a specification of U.S. patent application Ser. No. 174,444, there has been proposed a constitution (on-chip filter) having an iR cut-off filter provided on a chip of a CCD image sensor, but it has been recognized that the constitution of its filter must be further improved.

For example, it has been found that the use of a glass film containing metal ions, or a glass film having dye or pigment dispersed, as an on-chip filter for cutting off the infrared rays, might result in poor characteristics of the image sensor or less yield in manufacture.

As above described, regarding what construction should be taken to use an invisible light cut-off filter as the on-chip filter, it can be said that no detailed and sufficient research or examination has been made.

SUMMARY OF THE INVENTION

An object of the present invention is to provide a compact filter for an image sensor which can excellently sense the optical signal in a wide wavelength range from the visible to invisible region, and perform signal processing relatively easily, the filter having good filter characteristics for separating between visible light and the invisible light and preventing the occurrence of a film breakage failure and exfoliation in the post-process after formation.

It is another object of the present invention to provide a filter for image sensor provided on the light receiving surface of image sensor and having a multiplicity of thin layers laminated alternately.

Further, it is a further object of the present invention to provide a filter for image sensor for use in an image sensor in which a plurality of sensor arrays including a plurality of photoelectric conversion elements for color separating and converting the optical signal in the visible region into the electrical signal and a plurality of sensor arrays including a plurality of photoelectric conversion elements for color separating and converting the optical signal in the invisible region into the electrical signal are arranged side by side, characterized in that the filter for image sensor is formed as sensor array elements and made up of a plurality of layers consisting of a dielectric layer and a metal layer to separate between the optical signal in the visible region and the optical signal in the invisible region.

It is a further object of the present invention to provide a filter for image sensor made up of dielectric multi-layer alternating films consisting of a high refractive index layer and a low refractive index layer on a flattened plane over a photoelectric converter for converting the optical signal into the electrical signal, characterized in that said filter has a compressive stress, wherein the stress σ of a single film of said high refractive index layer or said low refractive index layer falls within a range $-5\text{ GPa} \leq \sigma < -0.2\text{ GPa}$.

BRIEF DESCRIPTION OF THE DRAWINGS

FIG. 3 is a typical cross-sectional view showing a part of manufacturing flow of the image sensor.

FIG. 15 is a spectral characteristic curve of an infrared absorption coloring matter.

FIG. 16 is a view showing an image pattern.

FIG. 19 is a diagram showing the configuration of a hardware for carrying out a decision algorithm.

DETAILED DESCRIPTION OF THE PREFERRED EMBODIMENTS

A filter for image sensor of the present invention is comprised of a multi-layer film provided on the light receiving surface of an image sensor.

The multi-layer film has at least two kinds of thin films laminated alternately, preferably, one of them being a dielectric film. More preferably, the other should be a metal thin film. Or it is preferable to use a film in which the stress of the dielectric film falls within a particular range.

The dielectric film may be appropriately selected in a layer thickness of single layer from 10 to 200 nm, and the metal thin film may be appropriately selected in a layer thickness of single layer from 10 to 50 nm. The number of laminated layers is appropriately selected as necessary, depending on the required spectral characteristics and the structure of image sensor.

The image sensor having a filter of the present invention may be an image sensor having a photodiode, a phototransistor or a photoconductive element as the photoelectric conversion element, the filter laminated directly or via an insulating layer on the semiconductor region which forms the light receiving face thereof. A flattened layer may be provided on the insulating layer as necessary.

The image sensor is not limited to sensors capable of color separation into four components R, G, B and iR, as described below, but may be any image sensor as far as it requires removal of the invisible light, for example, a sensor for R single color, a sensor for G single color, a sensor for B single color, and a monochrome sensor. Also, it may be a sensor for a complementary color such as yellow (Y), cyan (Cy) and magenta (M).

One embodiment of the present invention will be now described, using as an example an image sensor which can sense infrared rays in the invisible region.

Figure 1:
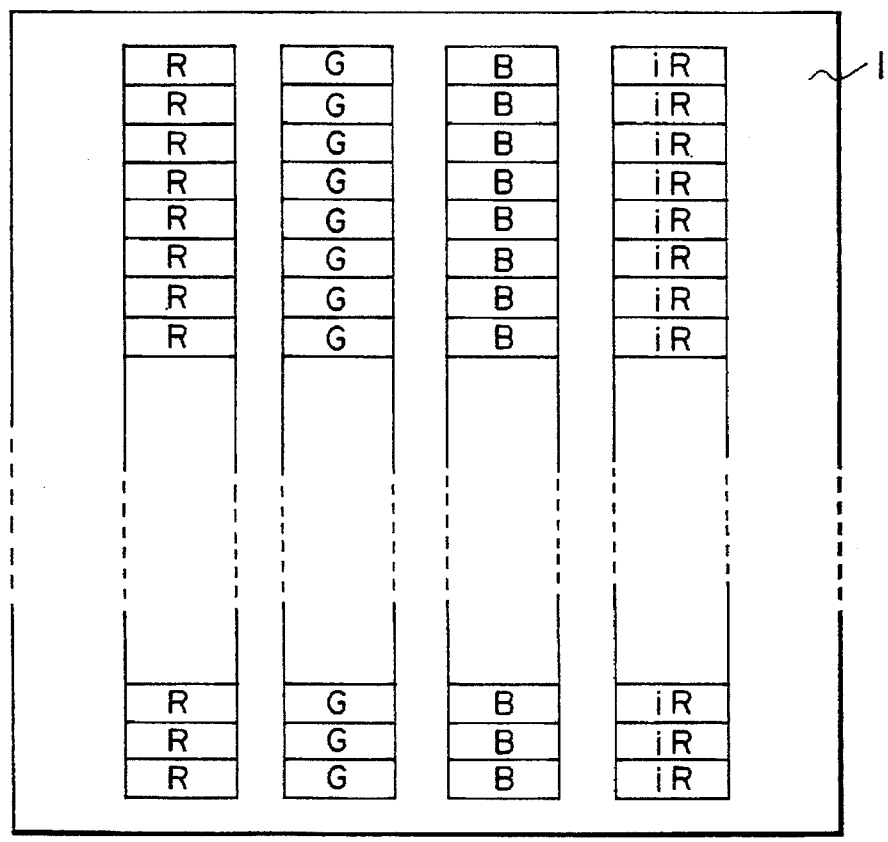
FIG. 1 is a typical plan view of an image sensor.

FIG. 1 shows a typical plan view of an image sensor to which the present invention is applied. This image sensor 1 has photoelectric conversion elements (R, G, B) for converting the optical signal in the visible region into the electrical signal, and a photoelectric conversion element (iR) for converting the optical signal in the invisible region into the electrical signal arranged side by side in four lines. The photoelectric conversion element used herein may be a photovoltaic element or a photoconductive element such as a photodiode or a phototransistor. And the photoelectric conversion element useful for the visible region has a lamination filter (iR cut-off filter) composed of a dielectric multi-layer film which can transmit the visible light and cut off the invisible light. To obtain the signal in a specific visible region, it has also a filter for transmitting selectively only the light in the specific region. That is, each of photoelectric conversion elements of R (red), G (green) and B (blue) has an inherent filter for transmitting only the light within a specific wavelength range in the visible region and a common filter for cutting off the invisible light.

On the other hand, the photoelectric conversion element (iR) for converting the optical signal in the invisible region into the electrical signal may be constructed of a material having sensitivity in a wide wavelength range covering the invisible light region, in combination with a filter having selective transmittance to the light in the invisible region.

Figure 2:
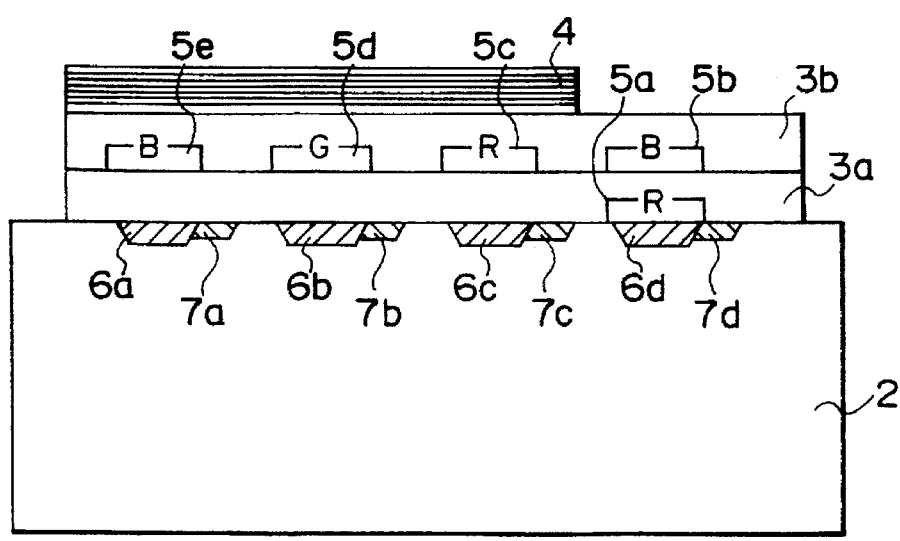
FIG. 2 is a typical cross-sectional view of the image sensor.

As above described, by the combination of each filter, it is possible to obtain the optical signal in each specific visible region and the invisible region. FIG. 2 shows a typical cross-sectional view of an example of the image sensor. On each of photodiodes 6a to 6d made on an Si substrate 2 is formed each filter to fulfill its function. Also, CCDs 7a to 7d for transferring the optical signal are arranged adjacent photodiodes 6a to 6d, respectively. On the photodiodes 6a to 6c, filters 5c, 5d, 5e for selectively transmitting only the light in the specific wavelength range and a filter 4 for cutting off the invisible light are provided, whereby the optical signal in the visible region can be obtained by the combination of the filters 5c, 5d, 5e and filter 4. Also, on the photodiode 6d, filters 5b, 5a for selectively transmitting only the light in the wavelength range of B, R are provided, whereby the optical signal in the invisible region can be obtained. 3a, 3b is a flattened film.

There is left some possibility of technical improvements in such filters for separating the visible light and the invisible light, and the manufacturing process thereof, as previously described.

In a manufacturing process of an image sensor according to one embodiment of the present invention, after forming a dielectric multi-layer film which serves as a filter, unnecessary portion is removed by RIE (Reactive Ion Etching) with the sensor part for the visible region left behind, and thereafter, the image sensor is manufactured according to the normal post-process. However, in such a manufacturing process, a problem arises that a film breakage failure in the dielectric multi-layer film may occur in performing the process including heating. This phenomenon is believed to arise due to the fact that organic flattened film extends in the heating process, which causes the dielectric multi-layer film formed thereon to undergo a thermal strain.

Also, the dielectric multi-layer film used in the present invention has alternating layers consisting of a high reflective index film having a relatively high index of refraction and a low refractive index film having a relatively low index of refraction, whereby the number of laminated layers is 20 to 30 layers to cut off the light in wide invisible region, with the total film thickness being as large as 2500 to 4000 nm. Hence, the control of the film stress is more difficult in proportion to the film thickness, in which there may possibly occur a problem that the manufacturing cost is high and dirt is likely to enter.

Also, when forming the filter 4 of dielectric multi-layer film, the alternating layers of a high refractive index film and a low refractive index film are used. Example of the high refractive index film may include $TiO_2$, $ZnS$, $Ta_2O_5$, $Nb_2O_3$, $ZrO_2$, $HfO_2$, $Y_2O_3$, $CeO_2$, $Al_2O_3$, $ZnO$ and their mixtures. Also, examples of the low refractive index film may include $Al_2O_3$, $SiO_2$, $MgF_2$, $Na_2AlF_6$ and their mixtures. The heating temperature of substrate in forming the film must be preferably in a temperature range from room temperature to 220° C., since when the flattened film 3a, 3b is formed of an organic resin such as a normal acrylic type polymer, it has lower heat resistance.

FIG. 3 is a typical cross-sectional view showing a forming process of the dielectric multi-layer film and its post-process. After treating a flattened film 8 (corresponding to a multi-flattened film 3a, 3b of FIG. 2), a multi-layer film 10 is provided, a pattern 11 is formed by applying a resist to remove unnecessary portion with the multi-layer film left on the visible region sensor unit, and etched by RIE. Further, the post-process includes forming an aluminum electrode pad 9, patterning of scribing portion, etching, further dicing, wirebonding, and sealing with glass 12, whereby a sensor chip is fabricated. At this time, mainly in the process of patterning, bonding, and glass sealing, heat of about 220° C. at maximum is applied thereto, and in attempting to obtain a sensor having an iR cut-off filter 4 of FIG. 2 laminated, there is a risk that a film crack may occur in the post-process if using the dielectric multi-layer film as the iR cut-off filter.

By the way, the metal film such as Au, Ag, Al having light absorbency is widely used as a metal reflection mirror when it is thick enough to be opaque or as a heat reflection mirror which can transmit the visible light beam and reflect the infrared light beam when it is thin. On the other hand, the dielectric film applied on the metal film or both faces has the protection effect of preventing the corrosion of metal, as well as the reflection preventing effect of lowering the reflectance with interference.

As a result of careful research regarding filters having less film thickness and film stress and good filter characteristics with a lower number of laminations, present inventors have found that the good filter characteristics of transmitting the light in the visible region and cutting off radiation in the wide invisible region can be obtained even with a thin film, with a constitution where the high refractive index dielectric layer and the metal layer are alternately laminated to further enhance the effect due to interference between the metal layer and the dielectric layer, and thus have attained the present invention.

Figure 4:
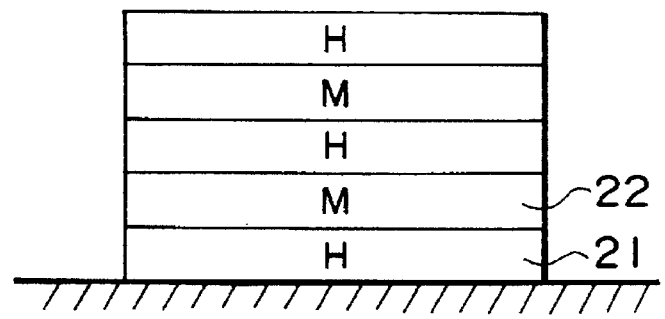
FIG. 4 is a typical cross-sectional view of a filter for image sensor according to one embodiment of the present invention.

That is, a filter for image sensor according to one embodiment of the present invention is formed as an element of sensor array to separate between the optical signal in the visible region and the optical signal in the invisible region, characterized in that the filter is composed of a plurality of layers consisting of a dielectric layer 21 and a metal layer 22, as shown in FIG. 4.

Examples of the dielectric layer of the present invention may include the same material as the high refractive index film, namely, $TiO_2$, $ZnS$, $Ta_2O_5$, $Nb_2O_3$, $ZrO_2$, $HfO_2$, $Y_2O_3$, $CeO_2$, $Al_2O_3$, $ZnO$ and their mixtures.

Also, examples of the metal layer 22 may include Au, Ag, Cu, and Al. Note that when used as the infrared cut-off filter, particularly silver or silver alloy having silver as the main component can be suitably used.

Note that a filter for image sensor of the present invention is preferably manufactured by vacuum deposition, rf ion plating or sputtering from the respects of the controllability of the film thickness, the prevention of corrosion of the metal film, and the prevention of mixing of the dirt.

According to the present invention, the film stress can be reduced with less number of laminations and less film thickness, but with good filter characteristics, and therefore, in forming the multi-layer film of the filter, a film breakage failure in the post-process after formation can be prevented, whereby the image sensor having good characteristics can be manufactured efficiently and stably.

The above-described embodiment can offer excellent visible light transmitting characteristics as well as preventing the breakage of film by using the metal layer to reduce the number of laminated layers. On the other hand, another embodiment of the present invention as described below can reduce the probability of film breakage even with a multi-layer constitution made of ten or more layers by designating the physical characteristics of each layer, more particularly, the stress.

In particular, if the stress σ of single layer is made $\sigma < -0.2$ GPa, the probability of film breakage will critically decrease, while if $\sigma \geq -5$ GPa, the probability of film exfoliation in dicing will critically decrease.

The measurement of the stress is made by using a sample which is obtained by forming the film for measurement of the stress on the glass substrate under the same film forming conditions as when forming each film which becomes a filter of the present invention. And this measurement of the sample is considered as the stress of each film which becomes a filter.

The measuring method of the stress is well known, and has been described in, for example, "Dynamic characteristics evaluation techniques of thin film", pp. 225–235, published by Realize Company.

Figure 5:
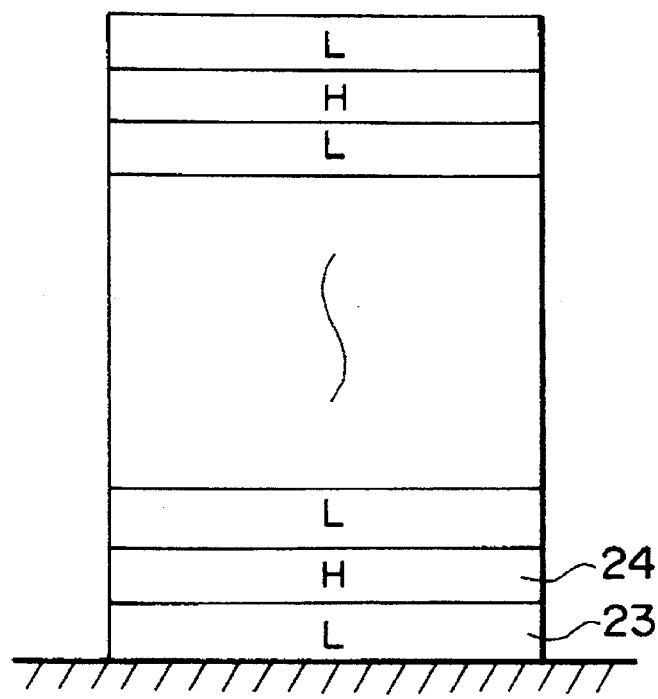
FIG. 5 is a typical cross-sectional view of a filter for image sensor in a comparative example of the present invention.

That is, a filter formed of a dielectric multi-layer of alternating films consisting of a high refractive index layer 24 and a low refractive index layer 23 on the flattened plane is provided with a compressive stress, as shown in FIG. 5, in which the stress σ of single film of the high refractive index layer 24 and the low refractive index layer 23 is in a range of −5 GPa (giga pascal) $\leq \sigma < -0.2$ GPa, whereby a filter having neither film breakage nor exfoliation can be obtained. More preferably, the range should be $-1 \text{ GPa} \leq \sigma < -0.2 \text{ GPa}$, and optimally $-0.3 \text{ GPa} \leq \sigma < -0.2 \text{ GPa}$.

The stress of the single film of the high refractive index layer or the low refractive index layer can be controlled by varying the manufacturing conditions such as the film depositing method, the substrate temperature for forming the film, the gas components, the gas pressure, and the bias potential.

For example, a film having a desired stress can be obtained by varying the pressure of Ar gas in sputtering, or varying the discharge electric power in plasma CVD.

According to the present invention, it is possible to prevent the film breakage and the film exfoliation in the post-process after forming the multi-layer film by controlling the stress. When the stress of the single film is tensile, the contact force is excellent, but a film breakage failure may occur. Then, the stress (σ) of the film normally varies under the film forming conditions, but if there is a compressive stress of preferably −0.2 GPa or greater ($\sigma < -0.2$ GPa), the film breakage failure can be prevented more stably. Also, when the stress of the single film is beyond −5 GPa ($\sigma < -5$ GPa), there is no film breakage failure, but the film exfoliation may occur (the sign of stress indicates the compressive stress with minus, and the tensile stress with plus). Herein, the number of layers, the material and the film thickness for the dielectric multi-layer film are not specifically limitative as far as the stress of the single film falls within the above range. Also, the manufacturing method of the dielectric multi-layer thin film is not specifically limitative as far as the method can control the compressive stress, such as vacuum deposition, sputtering, ion plating, ion assist, and CVD.

The examples of the present invention will be described below using the drawings. Note that the following examples are concerned with the filters for cutting off the light mainly in the infrared region, but the present invention is not limited to such filters in the wavelength region.

(Example 1)

After forming a flattened film of acrylic type polymer, a multi-layer film of five-layer configuration comprising alternating layers consisting of a high refractive index dielectric index layer and a metal layer was formed. The material of the high refractive index dielectric layer is titanium oxide and that of the metal layer is silver. Oxide gas was supplied into titanium oxide and argon gas supplied into silver so that the degree of vacuum at the film formation be held at 0.02 Pa, and the material of each film was evaporated in rf plasma at 100 W by resistive heating to form each film. The film thickness of each layer was set by the computer calculation, an optical film thickness monitor and a quartz film thickness monitor, with the film thickness of high refractive index layer being 30 nm per layer, and the film thickness of metal layer being 15 nm per layer, so that the total film thickness of five-layer configuration (three high refractive index dielectric layers and two metal layers) was 120 nm. It is desirable that the film thickness of high refractive index dielectric layer is selected in a range from 25 to 100 nm per layer and the film thickness of metal layer is selected in a range from 10 to 50 nm per layer.

Figure 6:
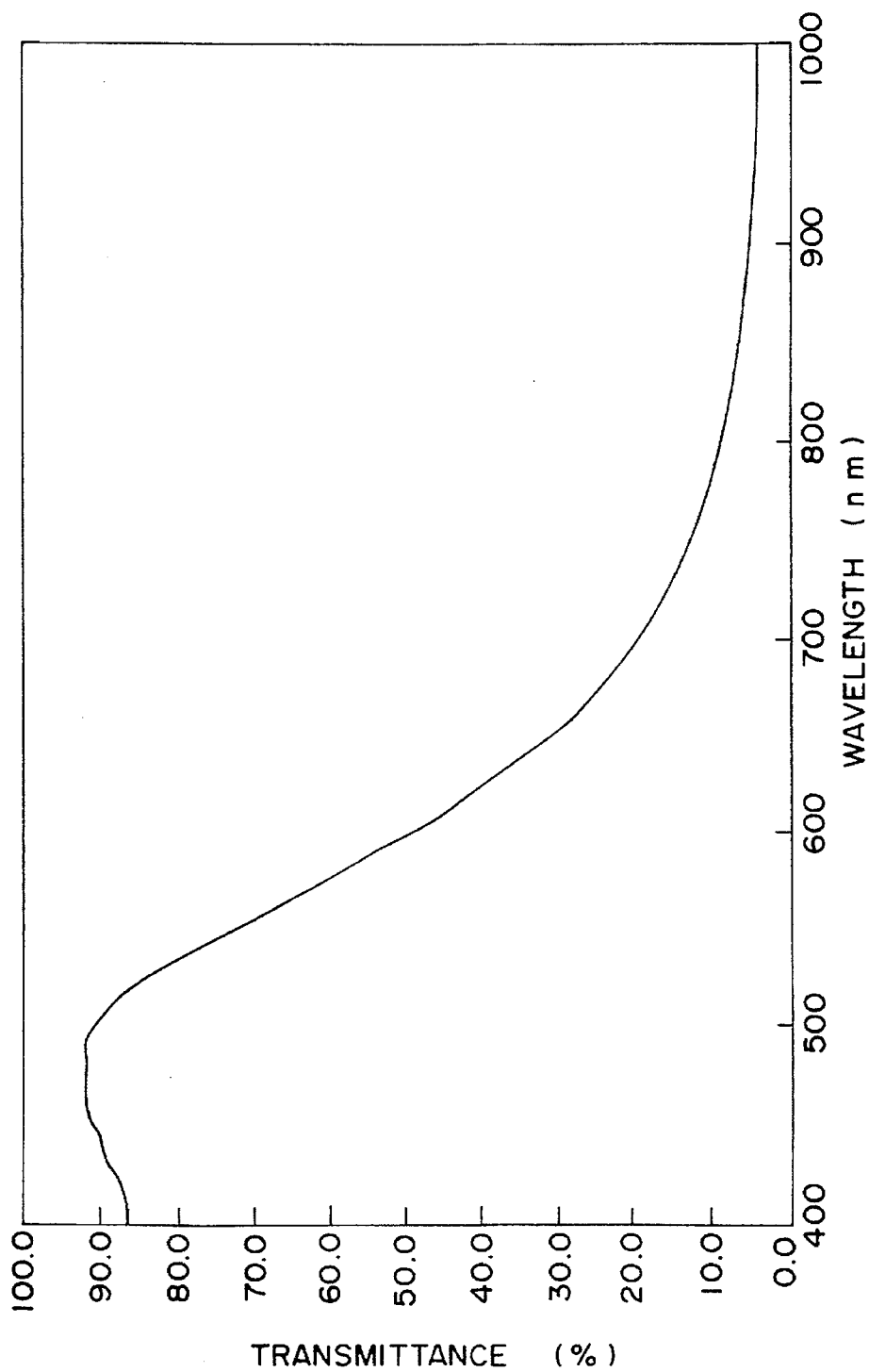
FIG. 6 is a film characteristic curve of an example 1 of the present invention.

FIG. 4 shows a cross-sectional view of the film configuration and FIG. 6 shows the film characteristic. In FIG. 4, 21 is a high refractive index dielectric layer and 22 is a metal layer.

After forming this multi-layer film, the post-process was conducted to fabricate plural image sensors, so that all sensors were excellently fabricated without occurrence of the film breakage.

(Example 2)

After forming a flattened film of acrylic type polymer, a multi-layer film of three-layer configuration comprising alternating layers consisting of a high refractive index dielectric layer, a metal layer and a high refractive index dielectric layer was formed by sputtering. The material of the high refractive index dielectric layer is titanium oxide and that of the metal layer is silver. Argon gas and nitrogen gas were supplied into silicone nitride and argon gas supplied into silver so that the degree of vacuum at the film formation be held at 0.3 Pa. The film thickness of each layer was set by the computer calculation and a quartz film thickness monitor, with the film thickness of high refractive index dielectric layer being 25 nm per layer, and the film thickness of metal layer being 25 nm per layer, so that the total film thickness of three-layer configuration was 75 nm. It is desirable that the film thickness of high refractive index dielectric layer is selected in a range from 25 to 100 nm per layer and the film thickness of metal layer is selected in a range from 10 to 50 nm per layer.

Figure 7:
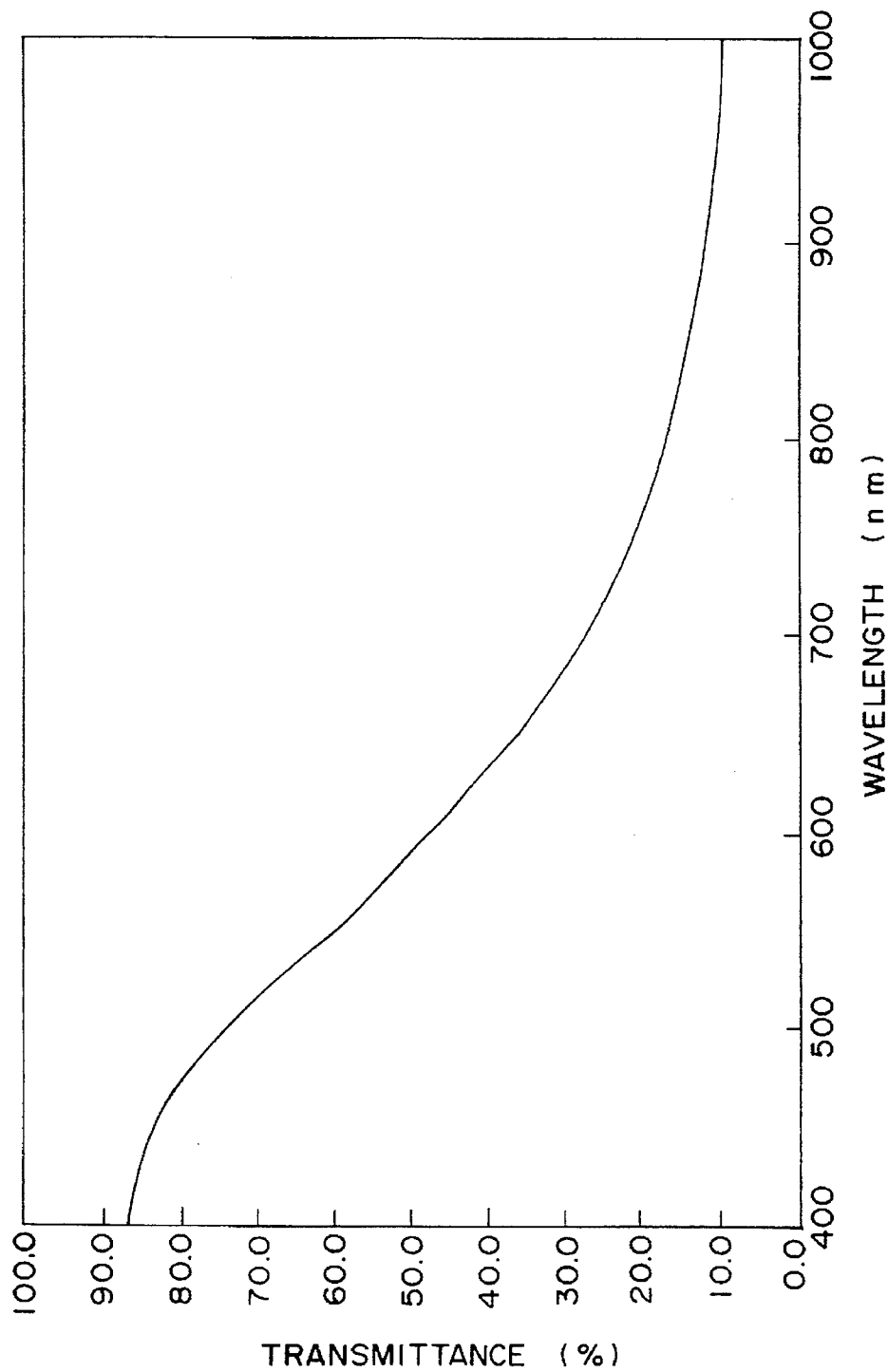
FIG. 7 is a film characteristic curve of an example 2 of the present invention.

FIG. 7 shows the film characteristic. After forming this multi-layer film, the post-process was conducted to fabricate plural image sensors, so that all sensors were excellently fabricated without occurrence of the film breakage.

(Example 3)

After forming a flattened film of acrylic type polymer, a contact layer composed of silicon oxide was provided 50 nm thick by vacuum deposition, and a multi-layer film of three-layer configuration comprising alternating layers consisting of a high refractive index dielectric layer, a metal layer and a high refractive index dielectric layer was formed thereon. The material of the high refractive index dielectric layer is titanium oxide and that of the metal layer is silver. Oxygen gas was supplied into silicon nitride so that the degree of vacuum at the film formation be held at 0.01 Pa, and the film was formed by evaporating the material of each film by resistive heating. The film thickness of each layer was set by the computer calculation, an optical film thickness monitor, and a quartz film thickness monitor, with the film thickness of high refractive index dielectric layer being 50 nm per layer, and the film thickness of metal layer being 25 nm per layer, so that the total film thickness of three-layer configuration (the first layer constituting a dielectric layer lamination film) was 125 nm. It is desirable that the film thickness of high refractive index dielectric layer is selected in a range from 25 to 100 nm per layer and the film thickness of metal layer is selected in a range from 10 to 50 nm per layer.

Figure 8:
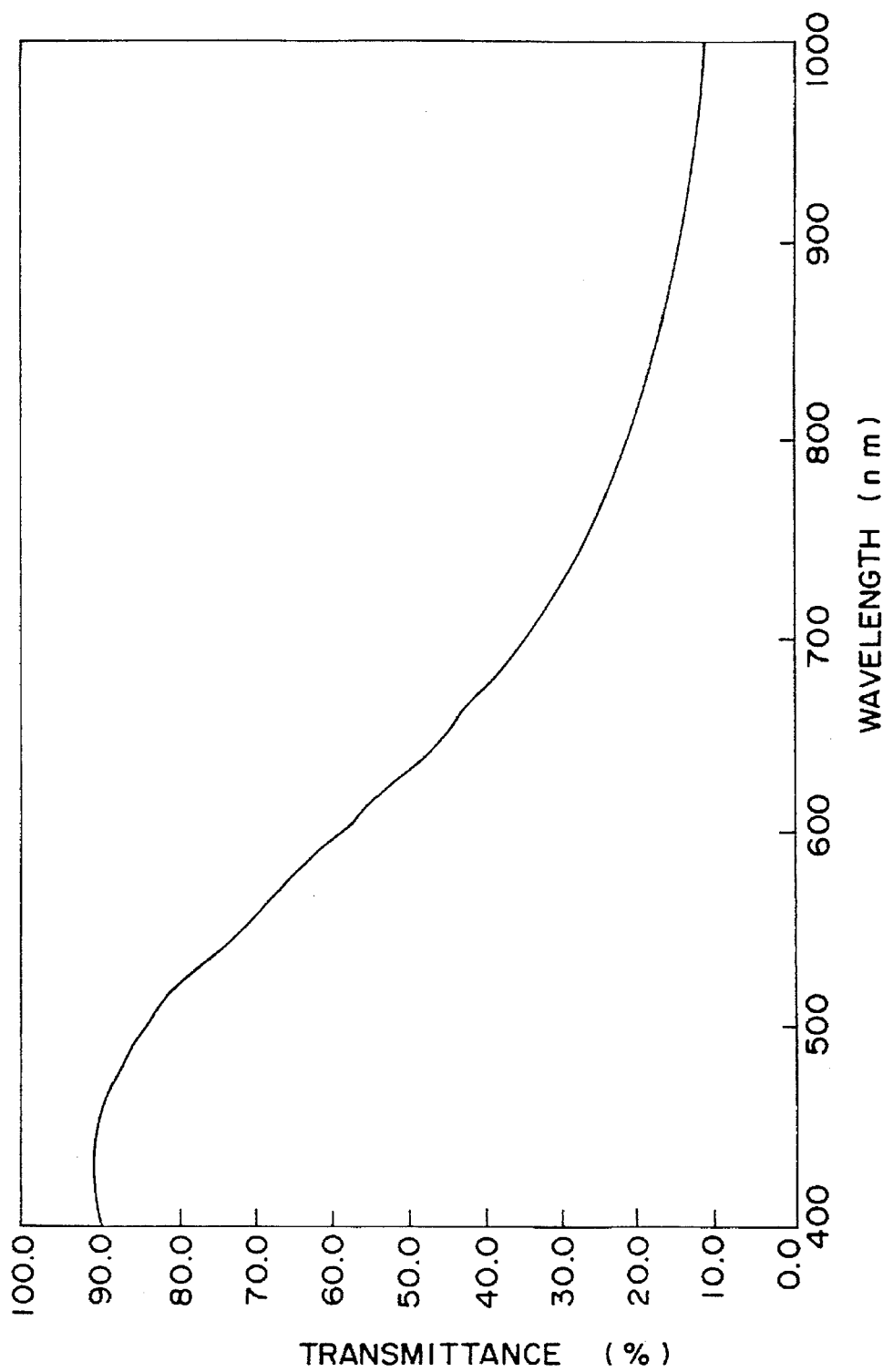
FIG. 8 is a film characteristic curve of an example 3 of the present invention.

FIG. 8 shows the film characteristic. After forming this multi-layer film, the post-process was conducted to fabricate plural image sensors, so that all sensors were excellently fabricated without occurrence of the film breakage.

(Example 4)

A multi-layer film of five-layer film configuration similar to that of example 1 was formed, with a filter film for correcting the light sensitivity in the visible region and the invisible region provided on the outside surface of sensor, and then an image sensor was fabricated by performing the post-process.

Figure 9:
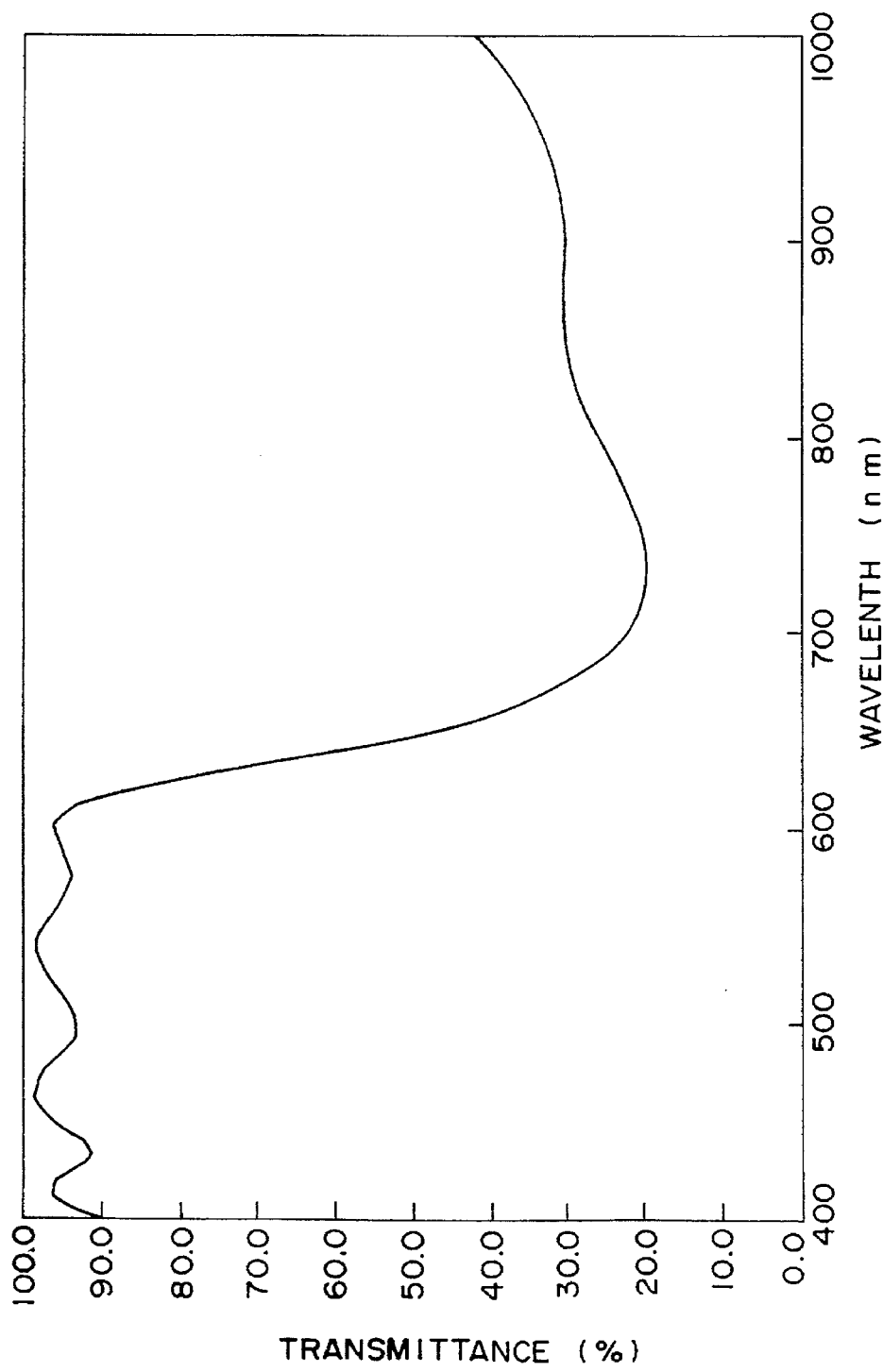
FIG. 9 is a correction film characteristic curve of an example 4 of the present invention.
Figure 10:
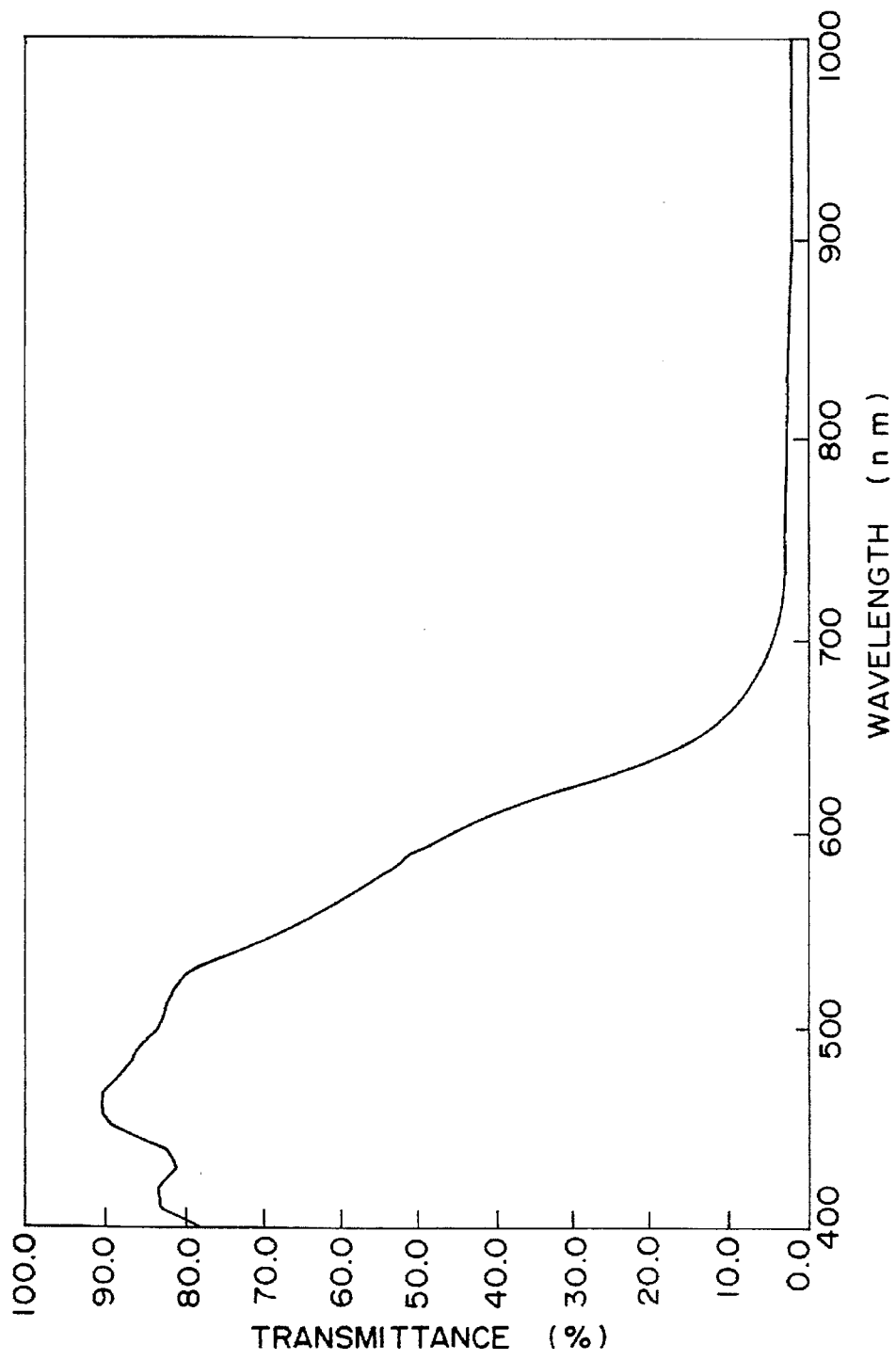
FIG. 10 is a composite film characteristic curve of an example 4 of the present invention.
Figure 11:
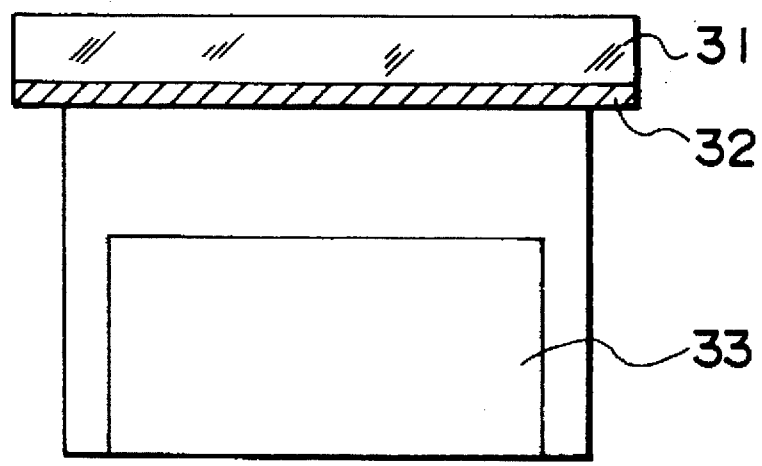
FIG. 11 is a typical cross-sectional view of a package in the example 4 of the present invention.

FIG. 9 shows a correction film characteristic, FIG. 10 shows a composite film characteristic, and FIG. 11 shows a typical cross-sectional view of a package. In FIG. 11, 31 is a sealing glass, 32 is a correction film, and 33 is a sensor. It does not matter that a filter for correction may be installed in the optical path leading to the external optical system as conventionally.

As above described, with the examples of the present invention, it is possible to form a filter composed of a multi-layer film directly on the image sensor, serving for the diversification of the function and usage of the image sensor. In particular, it is possible to obtain the filter characteristic with small film thickness on the flattened film, and thus to provide the image sensor with excellent characteristics and its manufacturing method by preventing the film breakage or film exfoliation in the post-process.

The examples 5 to 7 of the present invention will be described below. The examples as described below are mainly concerned with the filter for cutting off the light mainly in the infrared region, but the present invention is not limited to the following examples, and other multi-layer configuration or selection of material is allowed if the objects of the invention can be accomplished.

(Example 5)

Figure 12:
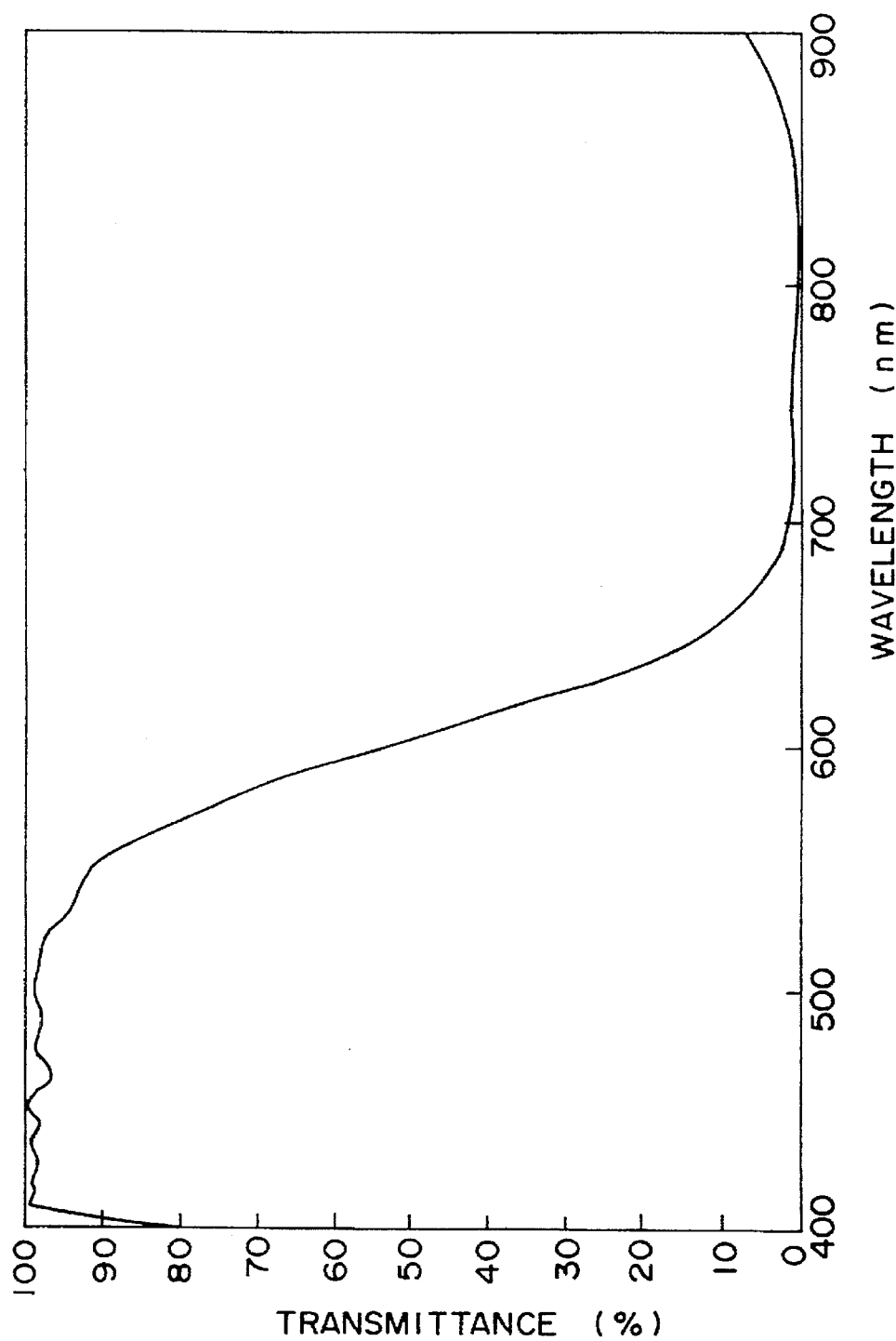
FIG. 12 is a spectral characteristic of an infrared cut-off filter according to the present invention.

After forming a flattened film of acrylic type polymer as shown at 8 in FIG. 3, a dielectric multi-layer 10 was formed by sputtering. The dielectric multi-layer has a characteristic of suppressing the transmittance of near infrared radiation in the invisible region, and transmitting the light in the visible region, comprising 21 alternating layers consisting of 11 $SiO_2$ films and 10 $TiO_2$ films. The degree of vacuum at the film formation was 0.27 Pa and the substrate temperature was 30° C. This film characteristic is shown in FIG. 12. Herein, the stress of $SiO_2$ was −0.5 GPa and the stress of $TiO_2$ was −0.5 GPa. The total stress of this film was −1250 N/m. After forming this film, an image sensor was fabricated by performing the post-process including patterning, etching, dicing, wirebonding, and heat sealing. Consequently, the image sensor presented excellent appearance without recognizable variation such as crack.

(Example 6)

An image sensor treated with up to wirebonding in the process of FIG. 3 but the film formation was prepared, and then the film formation identical to that of example 5 was made. Thereafter, the glass sealing process was conducted, whereby an image sensor was fabricated. Consequently, the image sensor presented excellent appearance without recognizable variation such as film crack, as in example 5.

(Example 7)

Figure 13:
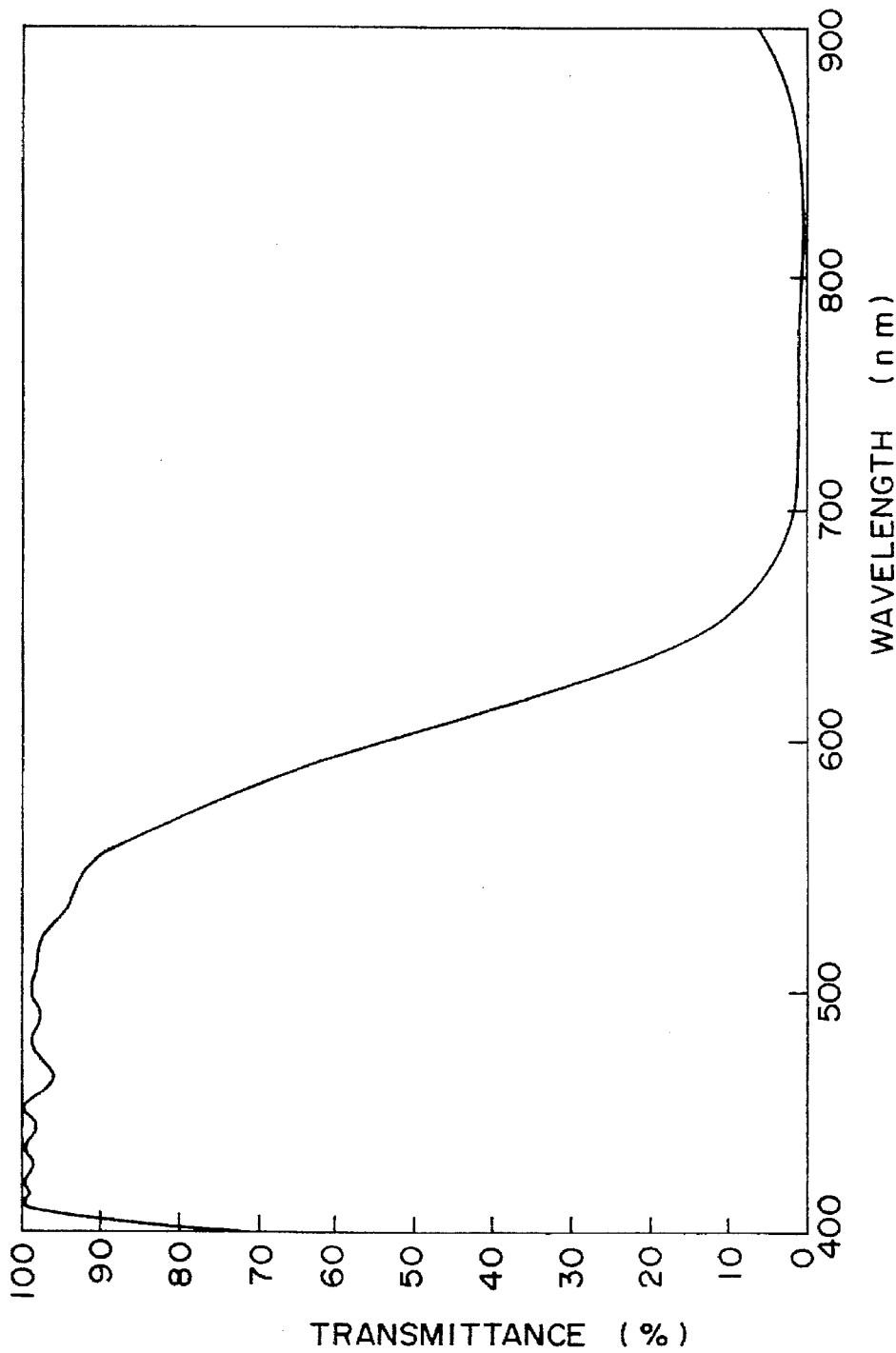
FIG. 13 is a spectral characteristic of the infrared cut-off filter according to the present invention.

After forming a flattened film of acrylic type polymer as shown at 8 in FIG. 3, a dielectric multi-layer 10 was formed by resistive heating deposition. The dielectric multi-layer has a characteristic of suppressing the transmittance of near infrared light in the invisible region, and transmitting the light in the visible region, comprising 21 alternating layers consisting of $SiO_2$ films and $TiO_2$ films. The degree of vacuum at the film formation was 0.0133 Pa for oxygen that was introduced and 0.004 Pa for ZnS, and the substrate temperature was 100° C. This film characteristic is shown in FIG. 13. Herein, $SiO_2$ used SiO as the deposition chemical. Herein, the stress of $SiO_2$ was −0.25 GPa and the stress of ZnS was −0.3 GPa. The total stress of this film was −639 N/m. After forming this film, the post-process including patterning, etching, dicing, wirebonding, and heat sealing was conducted to fabricate an image sensor. Consequently, the image sensor presented excellent appearance without recognizable variation such as crack.

(Comparative Example 1)

An iR cut-off filter comprising 21 alternating layers consisting of $SiO_2$ films and $TiO_2$ films was formed by vacuum deposition, as in example 5. The degree of vacuum at the film formation was 0.0266 Pa for $SiO_2$ film and 0.0133 Pa for $TiO_2$ film, and the substrate temperature was 30° C. Herein, the stress of $SiO_2$ was 0.02 GPa and the stress of $TiO_2$ was 0.2 GPa. The total stress of this film was 215 N/m. After forming this film, the post-process including patterning, etching, dicing, wirebonding, and heat sealing was conducted to fabricate plural image sensors. Consequently, more than one-half of image sensors did not operate as the sensor because of the occurrence of the crack on the film.

(Comparative Example 2)

Plural samples of dielectric multi-layer film comprising 21 alternating layers consisting of $SiO_2$ films and $TiO_2$ films was formed by sputtering, as in example 5. Sputtering was made by applying a bias of −150 V to the ground of substrate. The degree of vacuum at the film formation was 0.133 Pa and the substrate temperature was 100° C. Herein, the stress of $SiO_2$ was −7 GPa and the stress of $TiO_2$ was −5.5 GPa. The total stress of this film was −15500 N/m. After forming this film, the post-process was conducted, so that more than one-half of samples yielded whole face exfoliation in the dicing process.

(Image Information Processing Device)

An image information processing device using an image sensor of the present invention will be described below.

Figure 14:
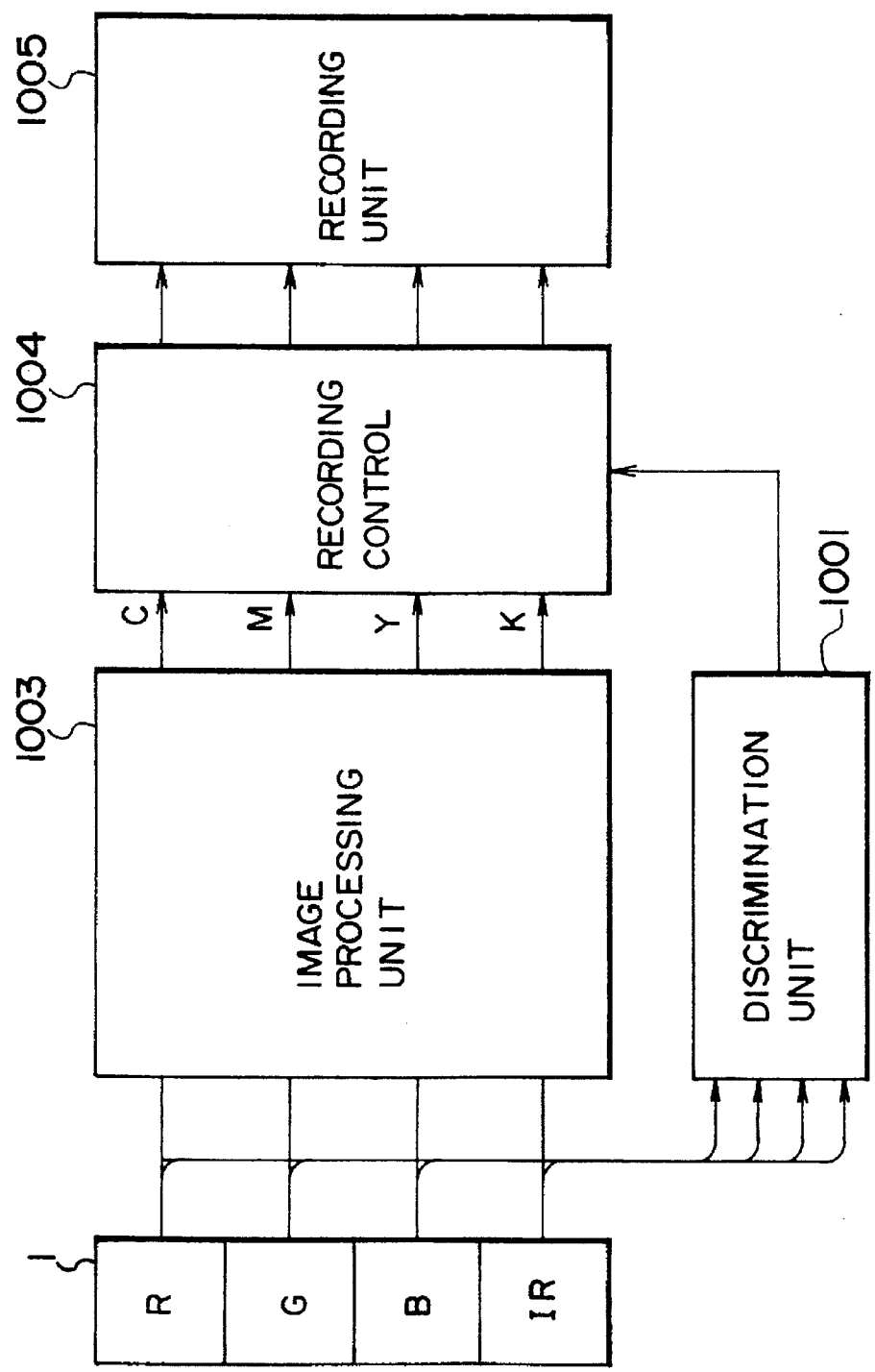
FIG. 14 is a block diagram of an image information processing device having an image sensor according to the present invention.

FIG. 14 shows a block diagram, wherein the signal from a solid-state image pickup device (sensor) 1 of each example as described is entered into an image processing unit 1003 and a discrimination unit 1001 as decision means. And the information thereof is reproduced and recorded by a recording unit 1005 which is driven by a recording control 1004.

The sensor 1 reads the original at a pixel density of 400 dpi by separating substantially the same point of the original into R (red), G (green), B (blue) components, and additionally an infrared component having sensitivity near roughly 1000 nm.

The sensor output is subjected to so-called shading correction, using a white plate and an infrared reference plate, and entered each as 8-bit image signal into the discrimination unit 1001 and the image processing unit 1003. The image processing unit 1003 performs various processings including variable magnification masking, OCR and so on which are typically performed in the color copying machine to produce four color signals of C, M, Y and K which are recording signals.

On the other hand, the discrimination unit 1001 performs the detection of specific patterns in the original which is characteristic of the present invention, with its result being output to the recording control 4, where the record signal is processed as necessary, such as painting with a specific color, and recorded on the recording sheet by the recording unit 1005, or the recording is stopped to disenable faithful image reproduction.

The image pattern to be detected in the present invention will be outlined below using FIGS. 15 and 16.

FIG. 15 shows a spectral characteristic of a transparent coloring matter which is substantially transmissive in the visible region and can absorb infrared rays near 800 nm, typical example of which is SIR-159 made by Mitsui Toatsu Chemicals, Inc.

FIG. 16 is a pattern example made by using the transparent ink composed of the above transparent infrared absorbent coloring matter. That is, a smaller pattern b of a square having a side length of about 120 μm is printed by using the above transparent ink on a triangular pattern recorded with an ink a for reflecting a particular or infrared ray. Since the same pattern is substantially of the same color in the visible region, as shown in the figure, the pattern b is indiscernible to the human's eyes, but is possible to detect in the infrared region. Note that though a pattern having a side length of about 120 μm was exemplified for the later description, but if this area b is read at 400 dpi, the area b can be read at 400 dpi to be as large as about 4 pixels as shown. Note that the forming method of the pattern is not limited to this example.

Figure 17:
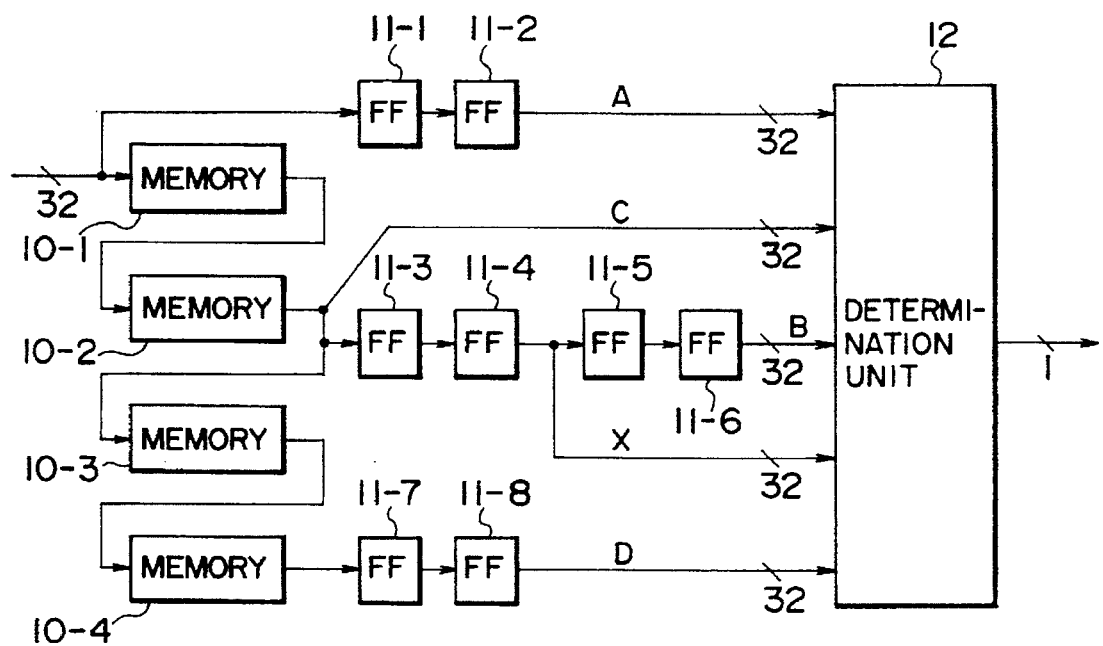
FIG. 17 is a block diagram showing the configuration of a discrimination unit of the device of FIG. 14.

The details of the discrimination unit 1001 of FIG. 14 will be further described using FIG. 17. In FIG. 17, 10-1 to 10-4 are image data delay portions constituted of FiFo, each delaying image data of 32 bits (8 bits×4 components) for one line.

Figure 18:
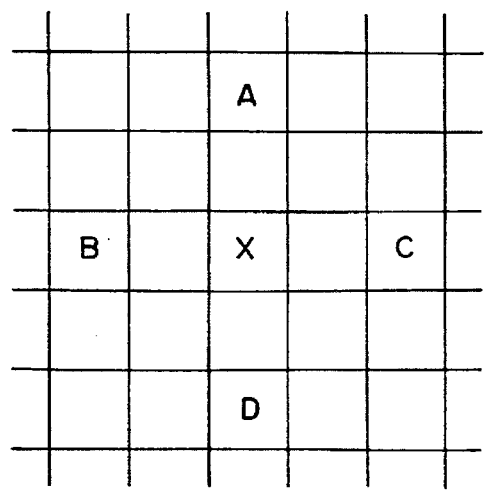
FIG. 18 is a diagram for explaining a discrimination method of the image pattern.

As input image signal is first delayed and held 2 pixels by flip-flops 11-1, 11-2 to have A pixel data, delayed 2 lines by memories 10-1, 10-2 to have C pixel data, further delayed 2 pixels by FF 11-3, 11-4 to have pixel data of notice X, and similarly delayed 2 pixels by FF 11-5, 11-6 to have B pixel data, and similarly D pixel data is obtained, which pixel data are input into the discrimination unit 12 simultaneously. Herein, the positional relation of A, B, C and D in the neighborhood of the pixel position of notice X is represented in FIG. 18.

That is, if the pixel of notice X reads the ink of portion b in FIG. 16, it follows that A, B, C and D read the image of a pattern located around it.

(Decision Algorithm)

It is supposed that R component constituting a pixel signal of A is $A_R$, G component is $A_G$, B component is $A_B$, infrared component is $A_{IR}$, and each component of R, G, B, IR constituting each pixel signal B, C, D is likewise defined. And the average values $Y_R$, $Y_G$, $Y_B$, $Y_{IR}$ of the same color components are obtained by the following expressions:

$$Y_R = \tfrac{1}{4}(A_R + B_R + C_R + D_R)$$

$$Y_G = \tfrac{1}{4}(A_G + B_G + C_G + D_G)$$

$$Y_B = \tfrac{1}{4}(A_B + B_B + C_B + D_B)$$

$$Y_{IR} = \tfrac{1}{4}(A_{IR} + B_{IR} + C_{IR} + D_{IR})$$

The decision of the pattern of object follows the difference between the average values obtained by the above expressions and the pixel of notice X. That is, the presence of a pattern is decided, if $\Delta R < K$
$\Delta G < K$ (K, L constant)
$\Delta B < K$
$\Delta IR > L$ where $\Delta R = |Y_R - X_R|$, $\Delta G = |Y_G - X_G|$, $\Delta B = |Y_B - X_B|$, $\Delta IR = Y_{IR} - X_{IR}$.

That is, it can be decided that the pixel of notice has smaller differences in color tint from its surrounding pixels in the visible region, and a difference of a constant L or greater in the infrared characteristic.

FIG. 19 is a hardware example in which the above decision algorithm is implemented. An adder 121 adds simply a color component of each of four pixels and outputs upper 8 bits thereof to obtain $Y_R$, $Y_G$, $Y_B$ and $Y_{IR}$, respectively. A subtracter 122 takes the difference of each component from the pixel of notice signal, and for three components of R, G and B, each absolute value is compared with a constant K as the reference signal by a comparator 126. Each output from the comparator as above is entered into an AND gate 127, in which a pattern is decided if "1" appears at its output terminal.

According to the present invention, it is possible to form a filter composed of a dielectric multi-layer film directly on the image sensor, serving for the diversification of the function and usage of the image sensor. In particular, by controlling the stress on its flattened film, it is possible to provide an image sensor having excellent characteristics by preventing the film breakage and film exfoliation in the post-process.

What is claimed is:

1. An image sensor comprising:

a first plurality of sensor arrays arranged side by side including a plurality of first photoelectric conversion elements for color separating and converting an optical signal in the visible region into an electrical signal;

a second plurality of sensor arrays arranged side by side including a plurality of second photoelectric conversion elements for color separating and converting the optical signal in the invisible region into an electrical signal, said first plurality of sensor arrays and second plurality of sensor arrays being arranged side by side with one another;

a color separation filter formed on said first photoelectric conversion elements to separate the optical signal in the visible region; and an invisible-light shielding filter, formed on said first photoelectric conversation elements, to shield the optical signal in the invisible region, said invisible-light shielding filter comprising a plurality of layers consisting of dielectric layers and metal layers, said invisible-light shielding filter being formed as a common layer with said color separation filter on said first plurality of sensor arrays.

2. An image sensor according to claim 1, wherein said metal layers are composed of a material selected from the group consisting of silver or a silver alloy having silver as its main component.

3. An image sensor according to claim 1, wherein said invisible-light shielding filter comprises alternating dielectric layers and metal layers, the dielectric layers having a high refractive index.

4. An image sensor according to claim 3, wherein said a material selected from the group consisting of aluminum oxide, zirconium oxide, titanium oxide, hafnium oxide, yttrium oxide, tantalum oxide, niobium oxide, silicon oxide, zinc oxide or a mixture thereof.

5. An image sensor according to claim 1, wherein said color separating filter includes a red light transmitting filter, a blue light transmitting filter and a green light transmitting filter.

6. An image sensor according to claim 1, wherein said invisible light shielding filter is arranged over said color separation filter.

7. An image sensor according to claim 1, wherein said image sensor is a complementary color image sensor.

8. An image sensor according to claim 1, wherein each of said first photoelectric conversion elements includes a photodiode.

9. An image sensor according to any of claims 1, 5, 6, 7 or 8, wherein said invisible-light shielding filter is an infrared ray cut filter.

10. An image sensor according to claim 1, wherein between said color separation filter and said invisible-light shielding filter, a flattened layer is provided.

11. An image sensor according to claim 1, wherein said invisible-light shielding filter is provided on said color separation filter.

* * * * *

UNITED STATES PATENT AND TRADEMARK OFFICE
CERTIFICATE OF CORRECTION

PATENT NO. : 5,648,653

DATED : July 15, 1997

INVENTOR(S) : JUNICHI SAKAMOTO, ET AL.

It is certified that error appears in the above-identified patent and that said Letters Patent is hereby corrected as shown below:

COLUMN 5

Line 40, "present" should read --the present--; and
    Line 41, "the good" should read --good--.

COLUMN 7

Line 17, "index" should be deleted.

COLUMN 10

Line 54, "As" should read --An--.

COLUMN 11

Line 24, "$\Delta R = |Y_R-X_R \cdot, \Delta G = \cdot Y_G-X_G \cdot, \Delta B = \cdot Y_B-X_B \cdot,$" should read --$\Delta R=|Y_R-X_R|, \Delta G=|Y_G-X_G|, \Delta B=|Y_B-X_B|,$--.

UNITED STATES PATENT AND TRADEMARK OFFICE
CERTIFICATE OF CORRECTION

PATENT NO. : 5,648,653

DATED : July 15, 1997

INVENTOR(S) : JUNICHI SAKAMOTO, ET AL.

Page 2 of 2

It is certified that error appears in the above-identified patent and that said Letters Patent is hereby corrected as shown below:

COLUMN 12

Line 12, "conversation" should read --conversion--;
    Line 27, "said a" should read --said dielectric layers are composed of a--; and
    Line 29, "halnium" should read --hafnium--.

Signed and Sealed this

Twenty-seventh Day of January, 1998

Attest:

BRUCE LEHMAN

Attesting Officer

Commissioner of Patents and Trademarks